United States Patent [19]

Belopolsky

[11] Patent Number: 5,453,017

[45] Date of Patent: Sep. 26, 1995

[54] SOLDERABLE CONNECTOR FOR HIGH DENSITY ELECTRONIC ASSEMBLIES

[75] Inventor: Yakov Belopolsky, Harrisburg, Pa.

[73] Assignee: Berg Technology, Inc., Reno, Nev.

[21] Appl. No.: 352,986

[22] Filed: Dec. 9, 1994

Related U.S. Application Data

[63] Continuation of Ser. No. 152,399, Nov. 15, 1993, abandoned.

[51] Int. Cl.⁶ .................................................. H01R 4/02
[52] U.S. Cl. ................................................ 439/83; 439/886
[58] Field of Search .................................... 439/876, 886, 439/83

[56] References Cited

U.S. PATENT DOCUMENTS

| | | | |
|---|---|---|---|
| 3,864,004 | 2/1975 | Friend | 439/876 |
| 4,183,611 | 1/1980 | Casciotti et al. | 439/876 |
| 5,104,324 | 4/1992 | Grabbe et al. | 439/62 |
| 5,199,884 | 4/1993 | Kaufman et al. | 439/74 |

Primary Examiner—Gary F. Paumen
Attorney, Agent, or Firm—Woodcock, Washburn, Kurtz, Mackiewicz & Norris

[57] ABSTRACT

An improved connector for an electronic module or the like includes a housing having a socket opening that is sized and configured to accept an electronic module, and a plurality of terminals mounted to the housing. Each of the terminals has a foot portion having a layer of non-solderable material coated on one side of the foot portion to prevent solder from adhering to that side. A capillary nest is formed by a channel surface on the underside of the foot portion when the terminal is mounted on a conductor pad such that solder flows through the capillary nest under the influence of capillary forces from the side of the terminal having a non-solderable coating thereon to the other side for forming a solder joint on that other side. A ring of non-solderable material is coated around a middle portion of the terminal to prevent solder from flowing to the electrical contact surfaces located above the ring. As a result, the connector terminals can be soldered to a printed circuit board or the like in a simple and inexpensive manner and without the formation of known solder defects.

30 Claims, 3 Drawing Sheets

SOLDERABLE CONNECTOR FOR HIGH DENSITY ELECTRONIC ASSEMBLIES

This is a continuation of application Ser. No. 08/152,399, filed Nov. 15, 1993, now abandoned.

BACKGROUND OF THE INVENTION

1. Field of the Invention

This invention relates to an improved surface mount connector for connecting an electronic module or package, such as a multi-chip module, to a printed circuit board.

2. Description of the Prior Art

An important trend in the electronics industry has been the increasing utilization of integrated circuits as individual components due to their relatively inexpensive cost, miniature size, and electrical dependability. Today it is common for hundreds of complex integrated circuits to be treated as discrete components by the design engineer, with such integrated circuits being appropriately packaged and electrically connected to their associated printed circuit boards. However, the small dimensions and tight tolerances of miniaturized electrical connectors preclude the use of holes in printed circuit boards for establishing mechanical, as well as electrical, connection between an electronic module and a printed circuit board.

Thus, in order to connect the densely packaged integrated circuit modules to an associated printed circuit board, very high density connectors utilizing surface mount technology ("SMT") have become prevalent in the industry. Such connectors comprise a plurality of small electronic terminals disposed within a housing and soldered to a printed circuit board or the like. The densely packed leads or contact pins of an electronic module are disposed into contacting engagement with the electronic terminals for establishing electrical interconnection with the printed circuit board.

The terminals of the electrical surface mount connectors are presently soldered to the conductive pads of a printed circuit substrate using known soldering techniques such as solder paste reflow, wave soldering, infra-red soldering, or vapor phase reflow. However, due to the extremely small pitch distances between adjacent leads of electronic modules and the terminals of the associated surface mount connectors, these solder techniques are known to produce undesirable defects in the solder joint, such as a solder bridge between adjacent terminals, a cold joint, or solder contamination of the contact area of the terminal.

Due to the extremely small pitch distance between adjacent terminals, pitch distances of 0.1 mm are desirable, these known solder defects often occur in combination and success in preventing one defect often results in an increased occurrence of another. For example, since a cold joint defect is a lack of solder connection between a connector terminal and a printed wiring board pad, this problem is treated by applying more solder to the connection area. However, since adjacent terminals are densely packed together, the increased flow of solder and the resulting surface tension of two adjacent pools of solder cause a solder bridge to form between adjacent terminals such that the terminals become electrically connected when the solder solidifies, thus causing a short circuit. In order to obviate the solder bridge problem, connector terminals are designed to provide for solder flow more readily over the surface area of the connector terminal. However, improved flow or wetting causes solder to travel up the connector terminal such that the solder contaminates the terminal contact area, generally plated with a noble metal, in the area of electrical connection with an electronic module.

It has not heretofore been possible to adequately reduce the effect of all of these problems simultaneously. Locating adjacent terminals farther apart on the printed circuit board in order to obviate the solder bridging problem is unfeasible since the goal in the connector industry is toward more densely packed electronic modules which must be connected to a printed circuit board. Strict control of the volume of solder used and close monitoring of the soldering process has been found to be costly and unreliable. Also, known pre-solder cleaning techniques and platings and corrosion resistance coatings have also been found to be costly and unreliable.

Thus, there is a long and unfilled need in the prior art for an improved surface mount connector for a high-density leaded or leadless electronic module that allows for simple and effective solder connection of the connector terminals to a printed circuit substrate. The present invention provides a surface mount connector which satisfies this need.

SUMMARY OF THE INVENTION

Accordingly, it is an object of the invention to provide an improved connector for a high-density electronic module that is inexpensive and simple in construction and which comprises surface mount terminals that can be effectively and reliably soldered to a printed circuit board or the like.

In order to achieve the above and other objects of the invention, an improved connector for an electronic module of the type that has a plurality of leads positioned on an underside adjacent to at least one edge thereof includes, a housing defining an opening that is sized and configured to accept an electronic module; a plurality of terminals, each of the terminals having a foot portion that is secured to the housing and a resilient contact portion that is cantilevered to the foot portion and that is constructed and arranged to be engaged by an edge of an electronic module for contacting at least one lead on an underside of the electronic module. One side of the foot portion of the terminal has a layer of non-solderable material coated thereon to prevent a solder joint form forming on that side of the terminal. A channel surface on the bottom of the foot portion of the terminal forms a capillary nest in association with the top surface of a solder pad on a printed circuit board. Solder flows through the capillary nest under the influence of capillary forces from the side of the terminal having the non-solderable coating thereon to the other side for forming a solder joint on that other side of the terminal. A ring of non-solderable material is coated on a middle portion of the terminal, between the foot portion and the contacting surface, for preventing solder from flowing up the terminal and contaminating the terminal contact surfaces.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 1:
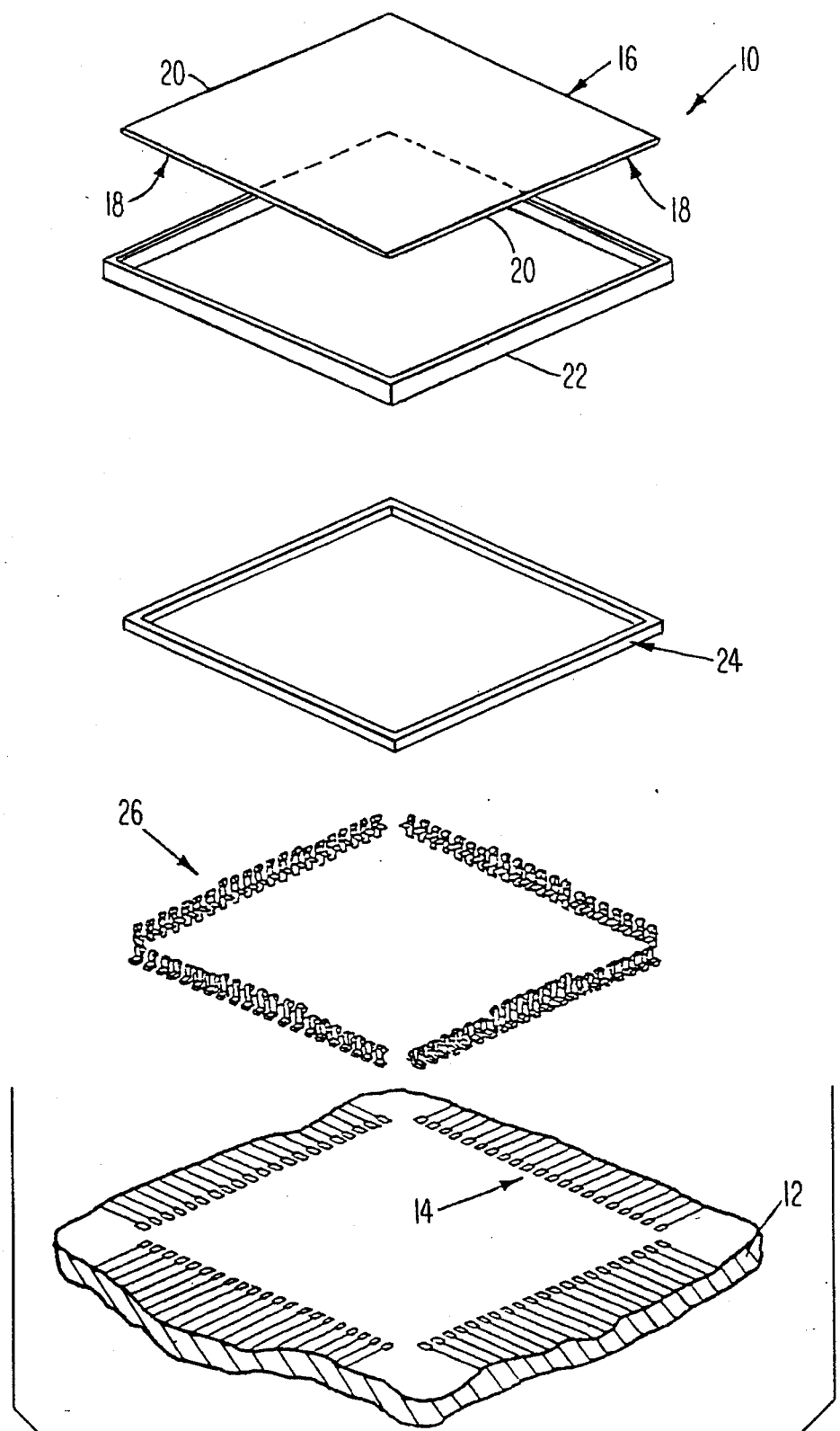
FIG. 1 is an exploded perspective view of an improved connector according to a preferred embodiment of the invention.

Referring now to the drawings, wherein like reference numerals designate corresponding structure throughout the views, and referring in particular to FIG. 1, an improved connector 10 is constructed and arranged to be attached to a motherboard or substrate 12 that has contacts 14, preferably comprising copper, thereon. Substrate 12 can be a printed circuit board or the like having electronic circuitry printed thereon for carrying out specific functions in a known manner.

Connector 10 is adapted to receive an electronic module 16 that is of the type that has a plurality of leads 18 positioned on an underside thereof adjacent to one or more edges 20 of the electronic module 16. Leads 18 can be substantially flat contact pads that are flush against the underside of module 16, or leads 18 can be contact pins that are bent downwardly orthogonally to the plane of the underside of module 16. Electronic module 16 is, for example, a multichip module of the type that includes several semiconductor chips interconnected with a high-density substrate into a single package.

Figure 2:
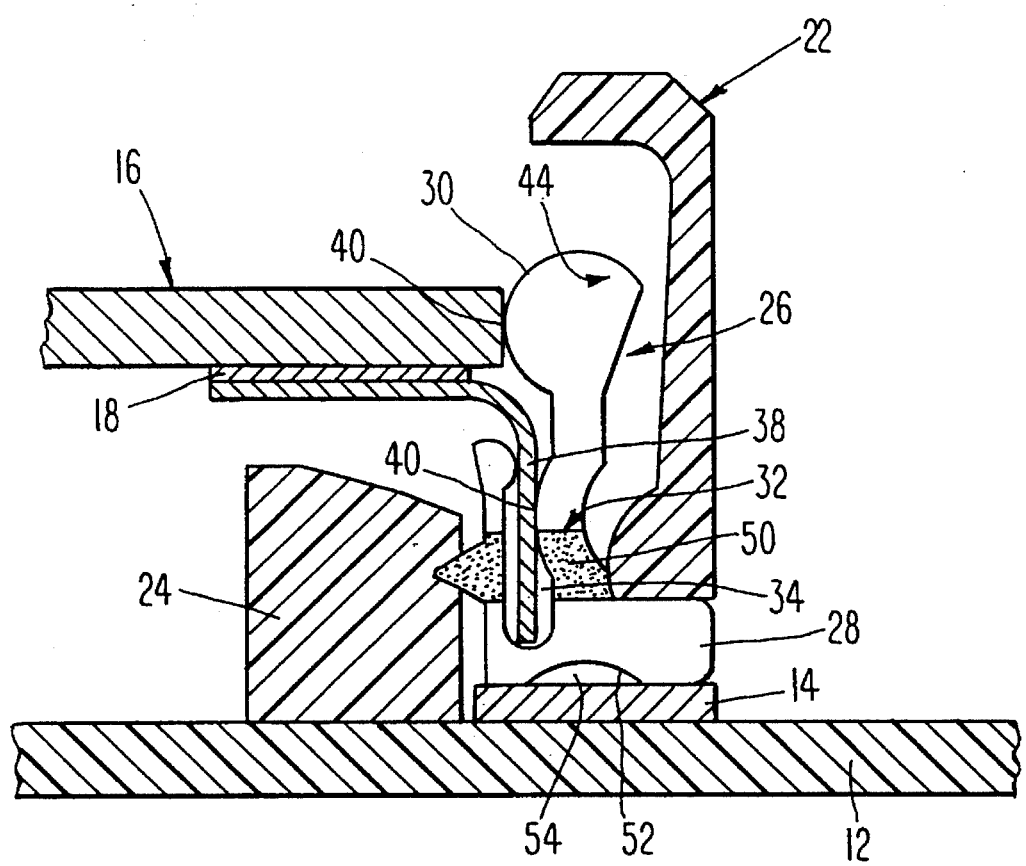
FIG. 2 is a fragmentary cross-sectional view of one component in the system depicted in FIG. 1.

As is best shown in FIGS. 1 and 2, connector 10 preferably includes a housing that has an outer housing portion 22 and an inner housing portion 24. Housing portions 22 and 24 are preferably fabricated from a non-conductive, non-metallic material, such as hard plastic. A plurality of connector terminals 26 are positioned between and securely mounted in outer housing portion 22 and inner housing portion 24. Terminals 26 preferably comprise a material having a high electrical conductivity and high elastic modulus, such as phosphorous bronze or beryllium bronze, and can be formed by any known manufacturing method, such as stamping or etching.

Figure 3:
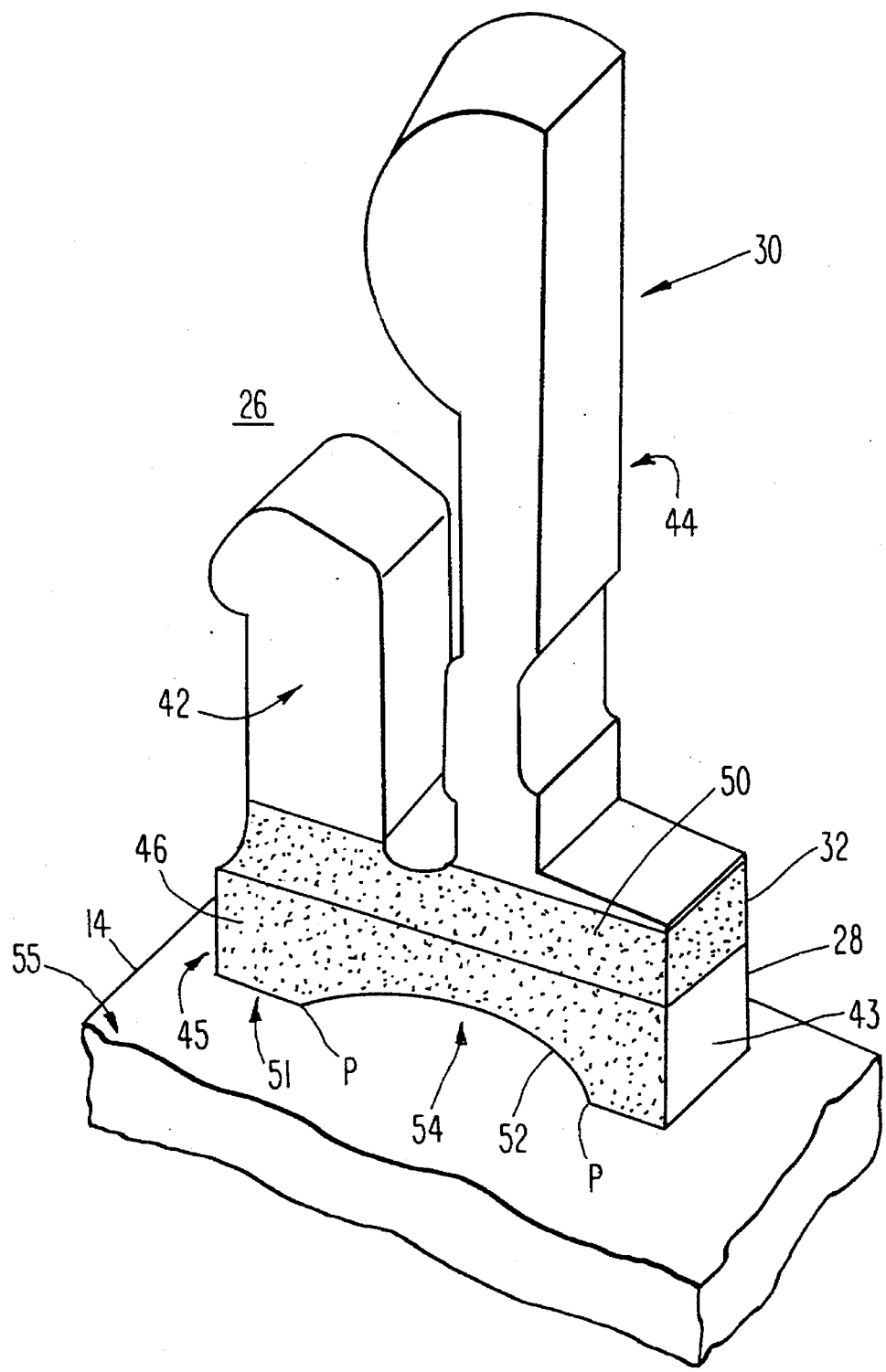
FIG. 3 is a perspective view of a surface mount connector terminal according to a preferred embodiment of the invention.

As shown in FIGS. 2 and 3, a terminal 26 includes a foot portion 28 mounted on pad 14 by any known solder method such that foot portion 28 is in electrical contact with the conductive pad 14 on substrate 12. A solder composition having silver as a constituent provides for reliable electrical connection between the connector terminal and the printed circuit board.

Terminal 26 further includes a contact portion 30 and a middle portion 32 located between foot portion 28 and contact portion 30. A deep slot 34 is formed in terminal 26 for receiving contact pin 38 formed as part of lead 18 of module 16. Pin 38 makes contact with contact portion 30 of terminal 26 at contact surfaces 40 such that module 16 is electrically connected to terminal 26. Terminal 26 can be coated over its entire surface with an electrically conductive material for preventing corrosion, such as nickel, and contact portion 30 can be plated with gold, palladium or other materials for establishing reliable electrical connection with the leads of module 16.

Terminal 26 interconnects module 16 to the printed circuitry (not shown) on substrate 12. Terminal 26 is a resilient, cantilevered beam member for mechanically securing edge 20 of module 16 into mechanical engagement with connector 10 in a known manner. Contact portion 30 of terminal 26 can be in contact with conductive traces (not shown) on housing portion 24 for connecting certain of the terminals 26 to ground.

It should be noted that the embodiment of terminal 26 shown in FIGS. 2 and 3 is only illustrative of an example of a surface mount terminal in accordance with the present invention and many other terminal configurations are within the scope of the invention in accordance with the features of the invention set forth in greater detail below. For example, terminal 26 can be configured for connection with leads 18 which are substantially flat contact pads or which are contact pins.

Referring to FIG. 3, terminal 26 is shown as having first longitudinal side 42 and second longitudinal side 44, as well as first lateral side 43 and second lateral side 45. The dimension along the lateral side of the terminal is herein referred to as the width of the terminal and the dimension along the longitudinal side is referred to as the length of the terminal. As shown, the height of the terminal 26 is substantially greater than the width of the terminal.

The surface of foot portion 28 along longitudinal side 42 is coated with a layer of non-solderable material to form coating 46 such that solder does not adhere to longitudinal side 42 when terminal 26 is soldered to pad 14. Referring to FIG. 2, the surface of foot portion 28 along the other longitudinal side 44 does not have any such non-solderable coating. Thus, in accordance with the present invention, only one longitudinal side of the foot portion of each connector terminal 26 is coated with a layer of non-solderable material. When terminal 26 is soldered to pad 14 solder flows and adheres only onto the longitudinal side of the foot portion of the terminal which does not have a non-solderable coating, as well as onto the two lateral sides 43, 45 which form the width of the terminal in the foot portion area.

Figure 4:
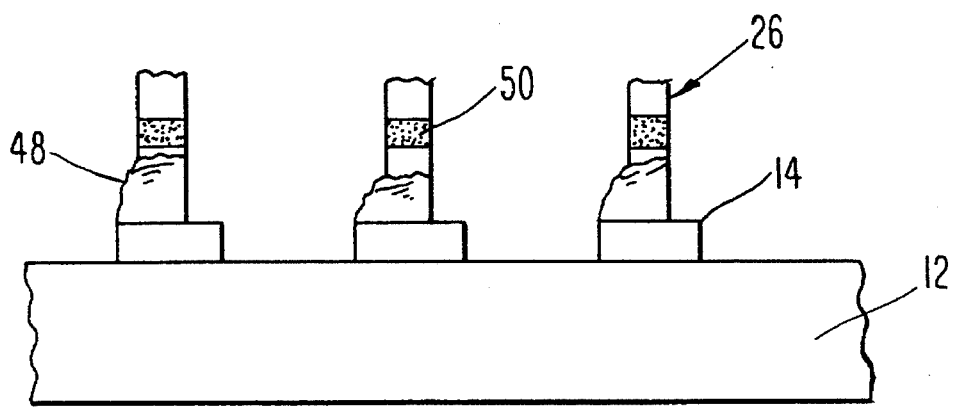
FIG. 4 is a broken-away end view of a preferred arrangement of connector terminals soldered to a printed circuit board in accordance with the present invention.

Terminals 26 are positioned on pads 14 such that the longitudinal side 42 of one terminal, having a non-solderable coating 46 thereon in the area of foot portion 28, is adjacent longitudinal side 44 of an adjacent terminal, wherein the longitudinal side 44 of the adjacent terminal does not have any such non-solderable material coating in the area of the foot portion. Thus, as shown in FIG. 4, solder 48 adheres only to one longitudinal side and along the two lateral sides of each terminal 26 such that an undesirable solder bridge does not form between adjacent terminals. In a preferred embodiment of the present invention, a surface mount connector 10 comprises a plurality of terminals 26 disposed in a housing 22, 24 for solderable engagement with a printed circuit board wherein the pitch distance between adjacent terminals is about 0.1 mm (0.004 inches). The pitch distance is herein referred to as the distance between the centerline of adjacent terminals.

Referring once again to FIGS. 2 and 3, a layer of non-solderable material is coated on all four sides of middle portion 32 of terminal 26 such that a non-solderable ring 50 is formed around the middle portion 32 of the terminal 26. Ring 50 prevents solder from flowing up terminal 26 and contaminating the contact surfaces 40 of contact portion 30. The location, or height, of ring 50 can be predetermined to provide that solder forms on longitudinal side 44 and lateral sides 43, 45 only to a desired height on the terminal. Terminal 26 is a cantilevered beam and the solder which adheres to the beam along the height of the terminal changes the cross-section, and thus the mechanical characteristics, of the beam. Thus, by placing ring 50 at a predetermined height to prevent the flow of solder up the terminal beyond the location of the ring, the height of the solder joint on the non-coated sides of the foot portion can be controlled to prevent changes in the mechanical characteristics of the beam which would cause it to break when an electronic module or the like is secured into the connector terminals.

In a preferred embodiment of the present invention, the non-solderable material used to provide the non-solderable coatings for a surface mount connector terminal comprises an electrically conductive material, such as aluminum. In another preferred embodiment, the non-solderable material comprises a non-conductive electrically insulating material, such as polyimide or epoxy. In yet another embodiment, the non-solderable coating comprises a passivated electroplating of material of 10 to 200 micrometers thickness comprising, by content, nickel at 60–90%, iron at 3–7%, and the balance of copper.

As shown in FIGS. 2 and 3, terminal 26 has a bottom surface 51 which is in contacting engagement with the top surface 55 of pad 14. Channel surface 52 is formed between points p on bottom surface 51 such that a capillary nest 54 is formed between the channel surface 51 and the top surface 55 of pad 14 when the terminal is positioned on pad 14. In a preferred embodiment, channel surface 52 is a convex curved surface.

During the soldering process, when terminal 26 is soldered into contacting engagement with substrate 12, capillary nest 54 allows molten solder to flow through the nest and along pad 14 under the influence of capillary forces. Thus, at the initiation of soldering the solder which is disposed on the top surface 55 of pad 14 begins to flow. The solder in the vicinity of the longitudinal side 42 of foot portion 28 flows through the capillary nest 54 since the solder does not flow onto the foot portion in this area due to the influence of the non-solderable coating 46. The solder in this region flows through the capillary nest under the influence of capillary forces in a known manner and onto the other side of the terminal for engagement with longitudinal side 44 of foot portion 28. Accordingly, a solder joint is formed on foot portion 28 only on longitudinal side 44 and lateral sides 43, 45 and the height of the solder joint is limited by non-solderable ring 50.

In a preferred embodiment of the present invention for a terminal having a total length along the longitudinal sides of 0.08 inches (80 mils), the height of the capillary nest 54, from top surface 55 to the top of channel surface 52, is 0.02 inches (20 mils) and the length of the capillary nest, the distance between points p-p, is 0.06 inches (60 mils). In another embodiment where the total length of the terminal is 0.04 (40 mils) inches, the height of the capillary nest is 0.01 inches (10 mils) and the length is 0.03 inches (30 mils). The height of the capillary nest should not be large enough to provide an attachment area on the channel surface 52 for the solder captured by capillary tension. Alternatively, the height of the capillary nest should not be small enough to prevent a flow of solder through the capillary nest such that solder is trapped on the unsolderable side of the terminal.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An electrical connector, comprising:

a housing;

a plurality of terminals for solderable engagement with a printed circuit board, said terminals disposed in said housing, each of said terminals having:

a foot portion having first and second longitudinal sides and further having first and second bottom surfaces for contacting engagement with the printed circuit board, of said first and second longitudinal sides only said first longitudinal side has a layer of non-solderable material coated thereon, said foot portion further having a channel surface located between said first and second bottom surfaces;

a middle portion, said middle portion having a layer of non-solderable material coated thereon; and a contact portion for receiving and establishing electrical connection with an electronic module, whereby said non-solderable coating prevents solder from adhering to said first longitudinal side and on said middle portion when said terminal is soldered to the printed circuit board and solder flows under the channel surface between the foot portion and the printed circuit board.

2. An electrical connector according to claim 1, wherein said non-solderable material comprises an electrically conductive material.

3. An electrical connector according to claim 1, wherein said non-solderable material comprises a non-conductive electrically insulating material.

4. An electrical connector according to claim 1, wherein said non-solderable material comprises polyimide.

5. An electrical connector according to claim 1, wherein said non-solderable material comprises, by content, nickel ranging from 60–90%, iron ranging from 3–7% and the balance nickel, said layer comprising a passivated electroplating having a thickness ranging from 10–200 micrometers.

6. An electrical connector according to claim 1, wherein said channel surface is a convex curve.

7. A circuit assembly, comprising:

a printed circuit board having a plurality of conductive pads thereon, each said conductive pad having a top surface;

an electrical connector having:
   a housing;
   a plurality of terminals disposed in said housing, each of said terminals disposed on and solderably connected to a corresponding pad on said printed circuit board, each of said terminals having:
   four external surfaces;
   a channel surface formed in said terminal such that a capillary nest is formed between said channel surface and said top surface of said conductive pad; and
   a layer of non-solderable material coated on a portion of one of said external surfaces in an area immediately adjacent to the top surface of the conductive pad.

8. An electrical connector according to claim 7, wherein the height of said capillary nest is 0.02 inches and the length is 0.06 inches.

9. An electrical connector according to claim 7, wherein the height of said capillary nest is 0.01 inches and the length is 0.03 inches.

10. A surface mount connector comprising a plurality of terminals for solderable engagement with a printed circuit board, said terminals being arranged adjacently and having a predetermined pitch distance therebetween, each terminal comprising a foot portion having first and second longitudinal sides at least one of which is disposed in facing relation to the longitudinal side of an adjacent terminal, a same one of said first and second longitudinal sides of the foot portion of each terminal having a layer of non-solderable material coated thereon, whereby the longitudinal side of each terminal having a non-solderable coating faces the longitudinal side of an adjacent terminal that does not have a non-solderable coating.

11. The surface mount connector of claim 10, wherein the foot portion of each terminal contacts a corresponding conductive pad on said printed circuit board, and wherein said layer of non-solderable material is coated on said one longitudinal side of the foot portion of each terminal in an area immediately adjacent a top surface of the corresponding conductive pad.

12. The surface mount connector of claim 10, wherein the predetermined pitch distance between adjacent terminals is about 0.1 mm.

13. The surface mount connector of claim 10, wherein the foot portion of each of said terminals further has first and second bottom surfaces for contacting engagement with the printed circuit board, and a channel surface located between said first and second bottom surfaces, whereby solder flows under said channel surface between the foot portion and the printed circuit board when said terminals are soldered to the printed circuit board.

14. The surface mount connector of claim 13, wherein said channel surface is a convex surface.

15. The surface mount connector of claim 10, wherein said non-solderable material comprises an electrically conductive material.

16. The surface mount connector of claim 10, wherein said non-solderable material comprises a non-conductive, electrically insulating material.

17. The surface mount connector of claim 10, wherein said non-solderable material comprises polyimide.

18. The surface mount connector of claim 10, wherein said non-solderable material comprises, by content, nickel ranging from 60–90%, iron ranging from 3–7% and the balance copper.

19. The surface mount connector of claim 10, wherein said layer of non-solderable material comprises a passivated electroplating of a non-solderable material having a thickness ranging from 10–200 micrometers.

20. The surface mount connector of claim 10, wherein each terminal further has a ring of non-solderable material formed around a middle portion thereof, between the foot portion and a contacting surface of said terminal.

21. A surface mount connector comprising a plurality of terminals for solderable engagement with a printed circuit board, said terminals being arranged adjacently and having a predetermined pitch distance of about 0.1 mm therebetween, each terminal comprising a foot portion having first and second longitudinal sides at least one of which is disposed in facing relation to the longitudinal side of an adjacent terminal a same one of said first and second longitudinal sides of the foot portion of each terminal having a layer of non-solderable material coated thereon, whereby the longitudinal side of each terminal having a non-solderable coating faces the longitudinal side of an adjacent terminal that does not have a non-solderable coating.

22. The surface mount connector of claim 21, wherein the foot portion of each terminal contacts a corresponding conductive pad on said printed circuit board, and wherein said layer of non-solderable material is coated on said one longitudinal side of the foot portion of each terminal in an area immediately adjacent a top surface of the corresponding conductive pad.

23. The surface mount connector of claim 21 wherein the foot portion of each of said terminals further has first and second bottom surfaces for contacting engagement with the printed circuit board, and a channel surface located between said first and second bottom surfaces, whereby solder flows under said channel surface between the foot portion and the printed circuit board when said terminals are soldered to the printed circuit board.

24. The surface mount connector of claim 23 wherein said channel surface is a convex surface.

25. The surface mount connector of claim 21 wherein said non-solderable material comprises an electrically conductive material.

26. The surface mount connector of claim 21 wherein said non-solderable material comprises a non-conductive electrically insulating material.

27. The surface mount connector of claim 21, wherein said non-solderable material comprises polyimide.

28. The surface mount connector of claim 21, wherein said non-solderable material comprises, by content, nickel ranging from 60–90%, iron ranging from 3–7% and the balance copper.

29. The surface mount connector of claim 21, wherein said layer of non-solderable material comprises a passivated electroplating of a non-solderable material having a thickness ranging from 10–200 micrometers.

30. The surface mount connector of claim 21, wherein each terminal has a ring of non-solderable material formed around a middle portion thereof, between the foot portion and a contacting surface of said terminal.

* * * * *